(12) United States Patent
Hanson et al.

(10) Patent No.: US 6,181,165 B1
(45) Date of Patent: Jan. 30, 2001

(54) REDUCED VOLTAGE INPUT/REDUCED VOLTAGE OUTPUT TRI-STATE BUFFERS

(75) Inventors: David R. Hanson, Brewster; Gerhard Mueller, Wappingers Falls, both of NY (US)

(73) Assignees: Siemens Aktiengesellschaft, Munich (DE); International Business Machines Corporation, Armonk, NY (US)

(*) Notice: Under 35 U.S.C. 154(b), the term of this patent shall be extended for 0 days.

(21) Appl. No.: 09/037,289

(22) Filed: Mar. 9, 1998

(51) Int. Cl.[7] ............................................. H03K 19/0185
(52) U.S. Cl. .................................. 326/81; 326/58; 326/83
(58) Field of Search .................................. 326/56–58, 83, 326/86, 68, 80–81

(56) References Cited

U.S. PATENT DOCUMENTS

| | | | |
|---|---|---|---|
| 5,128,560 | * 7/1992 | Chern et al. | 326/81 |
| 5,311,083 | * 5/1994 | Wanlass | 326/68 |
| 5,489,859 | * 2/1996 | Kawaguchi et al. | 326/57 |
| 5,614,859 | * 3/1997 | Ong | 326/80 |
| 5,627,487 | * 5/1997 | Keeth | 326/87 |
| 5,682,110 | * 10/1997 | Rountree | 326/113 |
| 5,764,082 | * 6/1998 | Taylor | 326/81 |
| 5,786,711 | * 7/1998 | Choi | 326/83 |

* cited by examiner

Primary Examiner—Jon Santamauro
(74) Attorney, Agent, or Firm—Stanton C. Braden

(57) ABSTRACT

There is disclosed a tri-state buffer circuit for receiving an input signal at a buffer input node and transmitting, responsive to a buffer enable signal, an output signal at a buffer output node. The buffer circuit includes an input stage coupled to the buffer input node. The input stage is configured to receive, when the buffer enable signal is enabled, the input signal. The buffer circuit further includes a level shifter stage coupled to the input stage. The level shifter stage is arranged to output, when the buffer enable signal is enabled, a set of level shifter stage control signals responsive to the input signal. A voltage range of the set of level shifter stage control signals is higher than a voltage range associated with the input signal. The buffer circuit also includes an output stage coupled to the level shifter stage. The output stage is configured to output, when the buffer enable signal is enabled, the output signal on the buffer output node responsive to the set of level shifter stage control signals. The voltage range of the output signal is lower than the voltage range of the set of level shifter stage control signals. The output stage decouples the buffer output node from the input stage and the level shifter stage when the buffer enable signal is disabled.

36 Claims, 11 Drawing Sheets

REDUCED VOLTAGE INPUT/REDUCED VOLTAGE OUTPUT TRI-STATE BUFFERS

BACKGROUND OF THE INVENTION

The present invention relates to buffer circuits. More particularly, the present invention relates to buffer circuits that are capable of receiving a reduced voltage input signal and driving an output also with a reduced voltage output signal.

In some circuits or integrated circuits, a buffer circuit may be employed to receive an input signal and sources or sinks enough current to drive an output conductor (e.g., a bus conductor) or the input gate of another circuit responsive to the signal input. A well-known type of buffer circuit is the tri-state buffer circuit. A tri-state buffer circuit has an output terminal that is either tri-state, high, or low. The ability to tri-state buffer circuits is particularly useful when multiple buffer circuits are coupled to the same load since this permits the buffer circuits that are not active in driving the bus to be decoupled therefrom in order to avoid signal contention on the bus.

To facilitate discussion, FIG. 1 illustrates a simplified prior art inverting tri-state buffer circuit 100, including four transistors in series 102, 104, 106, and 108. P-type field-effect transistor (p-FET) 102 is coupled to rail $V_{DD}$ and conducts only when the Enable signal is high. Note that unless otherwise indicated herein, all transistors are field-effect transistors (FETs). N-type transistor 108 is coupled to ground and also conducts only when the Enable signal is high (i.e., when EnableN signal is low). When the Enable signal is low, both transistors 102 and 108 are off, thereby tri-stating the output.

When the input signal is high and the Enable signal is also high, n-FET 106 and n-FET 108 will conduct to pull the output to ground. Simultaneously, p-FET 104 is off to decouple the output from $V_{DD}$. Conversely, when the input signal is low and the Enable signal is high, p-FETs 102 and 104 will conduct to pull the output to $V_{DD}$. Simultaneously, n-FET 106 is off to decouple the output from ground. As can be appreciated, the output of inverting tri-state buffer circuit 100 is the inverse of its input value.

Although the buffer circuit of FIG. 1 has been around for a long time, there are disadvantages. For example, since the tri-state buffer circuit 100 inverts its input, a cascading configuration is required to obtain a noninverting tri-state buffer circuit. To cascade, the output of inverting tri-state buffer circuit 100 may be cascaded into the input of another inverting tri-state buffer circuit 100 to obtain a non-inverting tri-state buffer circuit.

Furthermore, the use of four transistors in series in the output stage (e.g., transistors 102, 104, 106, and 108 in series) exacts a heavy penalty in terms of size. This is because each device in the pull up or pull down path must be fairly large in order to permit enough current to traverse the serially-connected devices in these paths. This is because if the devices are small, the amount of current output by the buffer circuit may be too low, which may introduce unacceptable delay when driving the output load to the desired voltage level.

However, the use of large devices increases the capacitive load on the output conductor, which in turn necessitates an even greater amount of power on the part of the driving buffer circuit to drive the output load properly since the driving buffer circuit sees both the capacitance of the output conductor as well as the capacitance of other tri-stated buffer circuits connected to the load.

Another disadvantage of the configuration shown in FIG. 1 relates to the fact that inverting tri-state buffer 100 is generally incapable of functioning as a reduced voltage input/reduced voltage output tri-state buffer circuit. Reduced voltage input refers to input voltages that are lower than the full $V_{DD}$ supplied to the chip. In some cases, the reduced voltage may be low enough (e.g., 1V) that it approaches the threshold voltage of the transistors (typically at 0.7 V or so). Likewise, reduced voltage output refers to output voltages that are lower than the full $V_{DD}$ supplied to the chip. Since reduced voltage signals (i.e., signals whose amplitude is within the reduced voltage range) are useful in reducing circuit power consumption, the inability of inverting tri-state buffer 100 to function as a reduced voltage buffer represents a serious shortcoming.

To appreciate the problems encountered in buffering reduced voltage signals, consider the situation wherein the input of inverting tri-state buffer 100 is logically high but is represented by a reduced voltage signal (e.g., around 1 V). In this case, not only does n-FET 106 conduct as expected but p-FET 104 may also be softly on, causing leakage current to traverse p-FET 104 (from $V_{DD}$ through p-FET 102). The presence of the leakage current degrades the signal on the output of the buffer circuit (and/or greatly increasing power consumption).

FIG. 2 illustrates another prior art tri-state buffer circuit, which is of the noninverting type. However, the non-inverting tri-state buffer circuit 150 is again found to be incapable of functioning as a reduced voltage input/reduced voltage output buffer circuit. To understand the operation of non-inverting tri-state buffer circuit 150 and its shortcoming in this regard, consider the situation when the input signal has a fill voltage range (i.e., from ground to $V_{DD}$). When EN signal is low on line 152, p-FET 130 is on to pull node 154 to $V_{DD}$ and turns off output p-FET 156. Concurrently, node 158 goes high by the operation of inverter 160. The high node 158 turns on n-FET 162 to pull node 164 low, thereby turning off output n-FET 166. Accordingly, output 168 is decoupled from the rest of the buffer circuit when enable signal EN goes low. As can be seen, a low EN signal tri-states buffer circuit 150.

When enable signal EN goes high and input 170 is high (e.g., at $V_{DD}$), the high input 170 causes n-FET 172 to conduct. Accordingly, node 164 is pulled to ground, thereby turning off output n-FET 166 and decouples output 168 from ground. At the same time, the high enable signal EN causes n-FET 174 to also conduct. Therefore, node 154 is pulled low. Note that p-FET 176 is off when input 170 is high, which decouples node 154 from $V_{DD}$. The low node 154 turns on output p-FET 156 to cause output 168 to be pulled to $V_{DD}$. Thus, a high input 170 and high enable signal EN causes output 168 to go high to $V_{DD}$.

Conversely, when enable signal EN is high and input 170 is low (e.g., at about ground), the low input 170 causes n-FET 172 to turn off to decouple node 164 from ground. The low input 170 also causes p-FET 176 to turn on. With p-FET 176 turned on, node 154 is pulled high and output p-FET 156 is turned off, thereby decoupling output 168 from $V_{DD}$. Since n-FET 174 is already on (due to high enable signal EN), node 164 is pulled high when p-FET 176 conducts, thereby turning on n-FET 166 to pull output 168 to ground. Thus a low input 170 and high enable signal EN causes output 168 to go low.

Non-inverting tri-state buffer circuit 150 is, however, unable to function when it is required to pass a reduced voltage input signal to its output. This deficiency of the prior art buffer circuits arises due, in part, to the fact that the input signal is employed to control one or more transistor gates. When so employed, the reduced voltage range of the input signal causes some p-FETs to be softly on even when the signal is logically high. For example, if the high logic state is represented by a reduced voltage signal (e.g., 1 V versus 2.5 V or higher of the full swing $V_{DD}$), the high logic input is represented by having, for example, the reduced voltage of 1V at input 170.

With 1V at input 170, n-FET 172 would be on but p-FET 176 may also be on, albeit a soft on. This is because if $V_{DD}$ of 2.5 volts is at the source of p-FET 176 and the threshold voltage of p-FET 176 is 0.7V, the presence of 1V at the gate of p-FET 176 will likely cause this transistor to be on softly. In other words, there is leakage current through p-FET 176 when it should be off. When both these transistors conduct, power consumption is unduly increased. With both transistors 172 and 176 on, the voltage at nodes 154 and 164 may be unstable and/or not be sufficiently well defined to turn on p-FET 156 and turn off n-FET 166 to pull output 168 to the desired high logic value.

As can be appreciated from the foregoing, there are desired tri-state buffer circuits, and methods for making same, that can be employed in reduced voltage signaling applications.

SUMMARY OF THE INVENTION

The invention relates, in one embodiment, to a tri-state buffer circuit for receiving an input signal at a buffer input node and transmitting, responsive to a buffer enable signal, an output signal at a buffer output node. The buffer circuit includes an input stage coupled to the buffer input node. The input stage is configured to receive, when the buffer enable signal is enabled, the input signal. The buffer circuit further includes a level shifter stage coupled to the input stage. The level shifter stage is arranged to output, when the buffer enable signal is enabled, a set of level shifter stage control signals responsive to the input signal. A voltage range of the set of level shifter stage control signals is higher than a voltage range associated with the input signal. The buffer circuit also includes an output stage coupled to the level shifter stage. The output stage is configured to output, when the buffer enable signal is enabled, the output signal on the buffer output node responsive to the set of level shifter stage control signals. The voltage range of the output signal is lower than the voltage range of the set of level shifter stage control signals. The output stage decouples the buffer output node from the input stage and the level shifter stage when the buffer enable signal is disabled.

In another embodiment, the invention relates to a method for providing an output signal responsive to an input signal. The method includes receiving the input signal using an input stage of a buffer circuit. There is further included forming, using a level shifter stage of the buffer circuit, a set of control signals responsive to the input signal. A voltage range of the set of control signals is higher than a voltage range associated with the input signal. Further, there is included outputting, using an output stage of the buffer circuit, an output signal responsive to the set of control signals. The voltage range associated with the output signal is lower than the voltage range of the control signals.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

The invention relates, in one embodiment, to a highly efficient reduced voltage in/reduced voltage out tri-state buffer circuit for use in asserting an output signal having a reduced voltage range responsive to an input signal also having a reduced voltage range. In one embodiment, the inventive reduced voltage in/reduced voltage out tri-state buffer circuit includes an input stage for receiving the reduced voltage input signal, a level shifter stage for converting the received reduced voltage input signal into internal level shifter stage control signals having a higher voltage range for controlling an output stage of the tri-state buffer circuit.

When the tri-state buffer circuit is tri-stated by disabling a buffer enable signal, it is essentially decoupled from the load. When not being tri-stated, the output stage outputs, responsive to the internal level shifter stage control signals, either a logical high or a logical low buffer output signal in the reduced voltage range.

Figure 1:
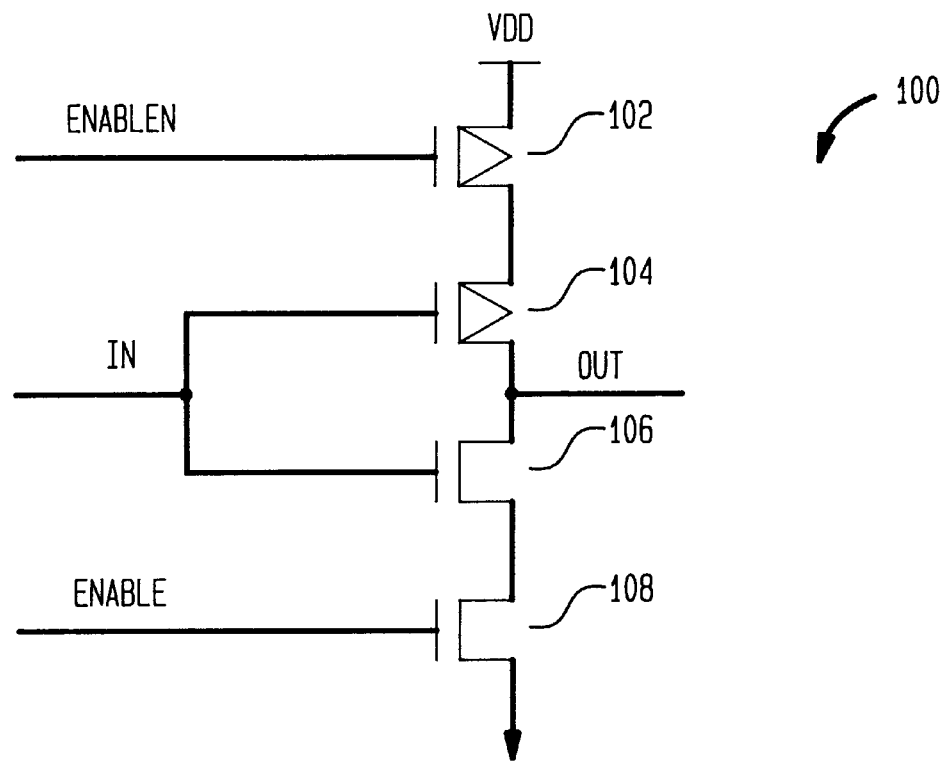
FIG. 1 illustrates a simplified prior art inverting tri-state buffer circuit to facilitate discussion.
Figure 2:
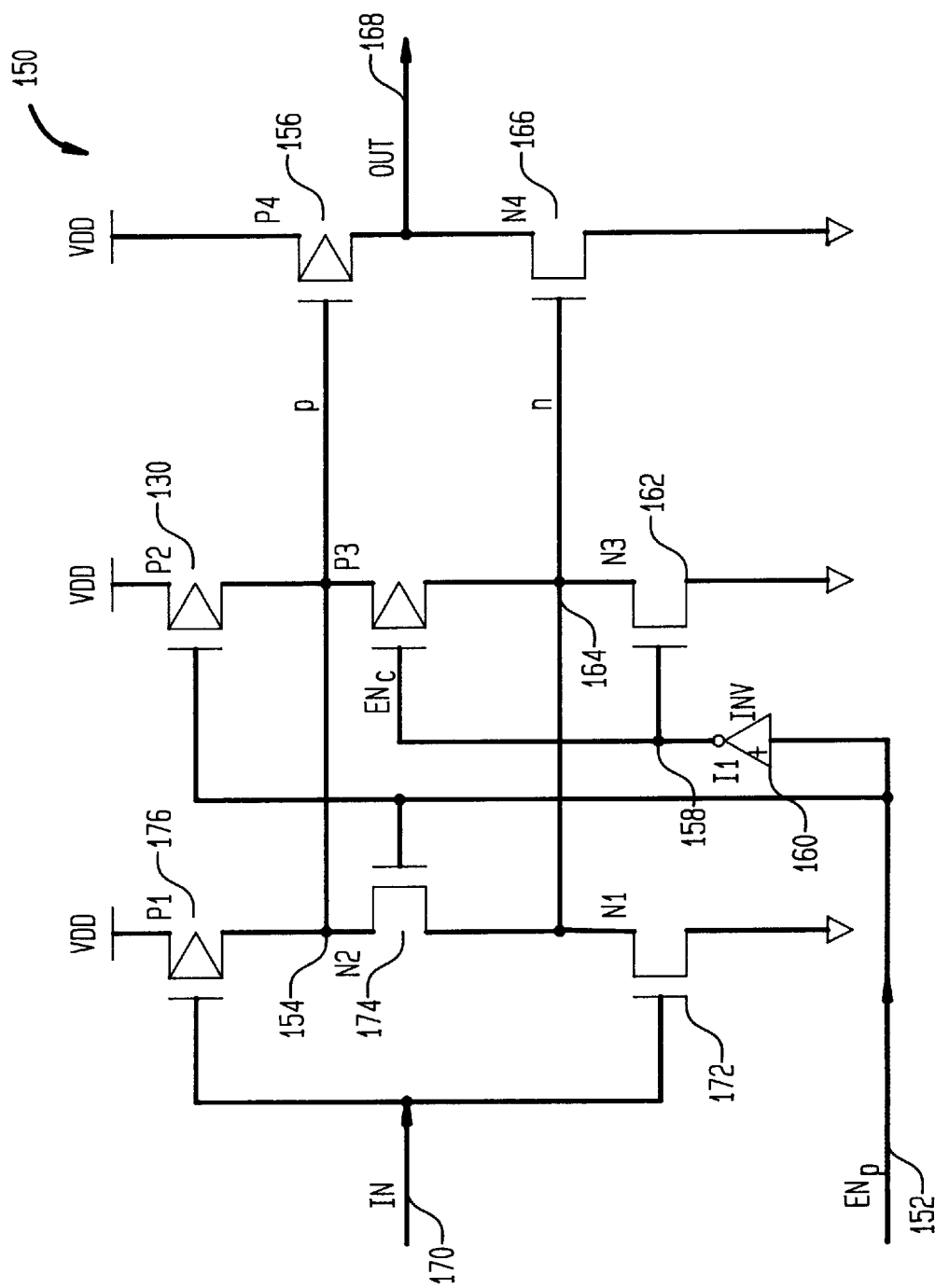
FIG. 2 illustrates another prior art tri-state buffer circuit, which is also inapplicable for use as a reduced voltage input/reduced voltage output buffer circuit.

In some cases, the buffer circuit is arranged so that it is unnecessary to employ the input signal, which has a reduced voltage range, to control transistor gates of the input stage. This is in contrast to the situation of prior art FIGS. 1 and 2 wherein the input signal is employed to directly control transistor gates. To control the output stage, the input signal is preferably boosted to a higher voltage level using the level shifter stage. Accordingly, the fact that the input signal may have a voltage range not substantially larger than the threshold voltage of the transistors does not degrade buffer circuit performance.

Figure 3:
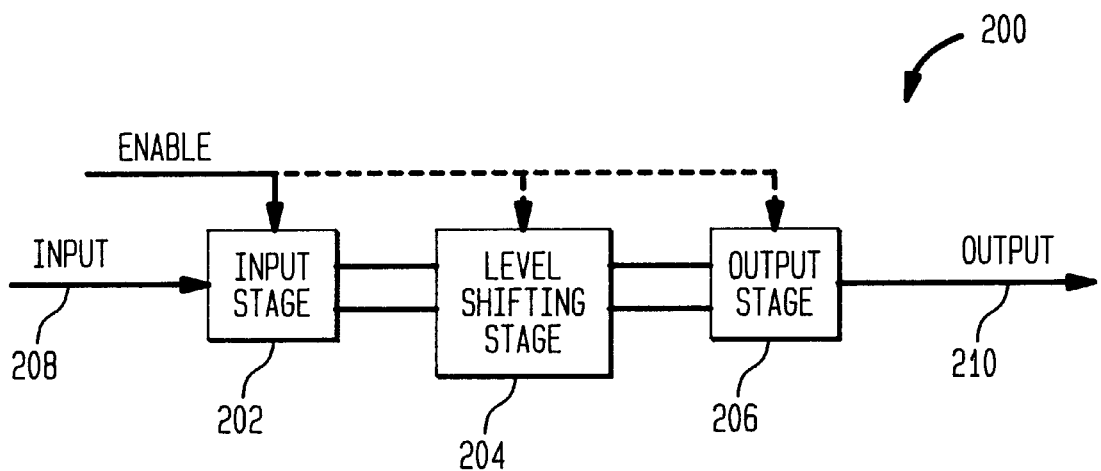
FIG. 3 illustrates, in accordance with one embodiment of the present invention, a simplified tri-state buffer circuit, representing a tri-state buffer circuit that is capable of passing reduced voltage signals.

The features and advantages of the present invention may be better understood with reference to the figures that follow. FIG. 3 illustrates, in accordance with one embodiment of the present invention, a simplified tri-state buffer circuit 200, including input stage 202, level shifting stage 204, and output stage 206. As shown, the buffer enable signal is coupled to input stage 202 to control transistors therein, which pass the reduced voltage input signal on terminal 208 to level shifting stage 204. As will be shown later herein, the buffer enable signal is also employed in some embodiments to control the passage of signals within level shifter stage 204 and/or the output stage 206.

Within level shifting stage 204, transistors therein shift the received input signal to a higher voltage range to control gates of transistors within output stage 206. The higher voltage control signals permit transistors within output stage 206 to be controlled with a higher overdrive voltage, thereby permitting transistors within output stage 206 to source/sink a greater amount of current, thus more rapidly drive the load coupled to the buffer output to the desired reduced voltage level.

Figure 4:
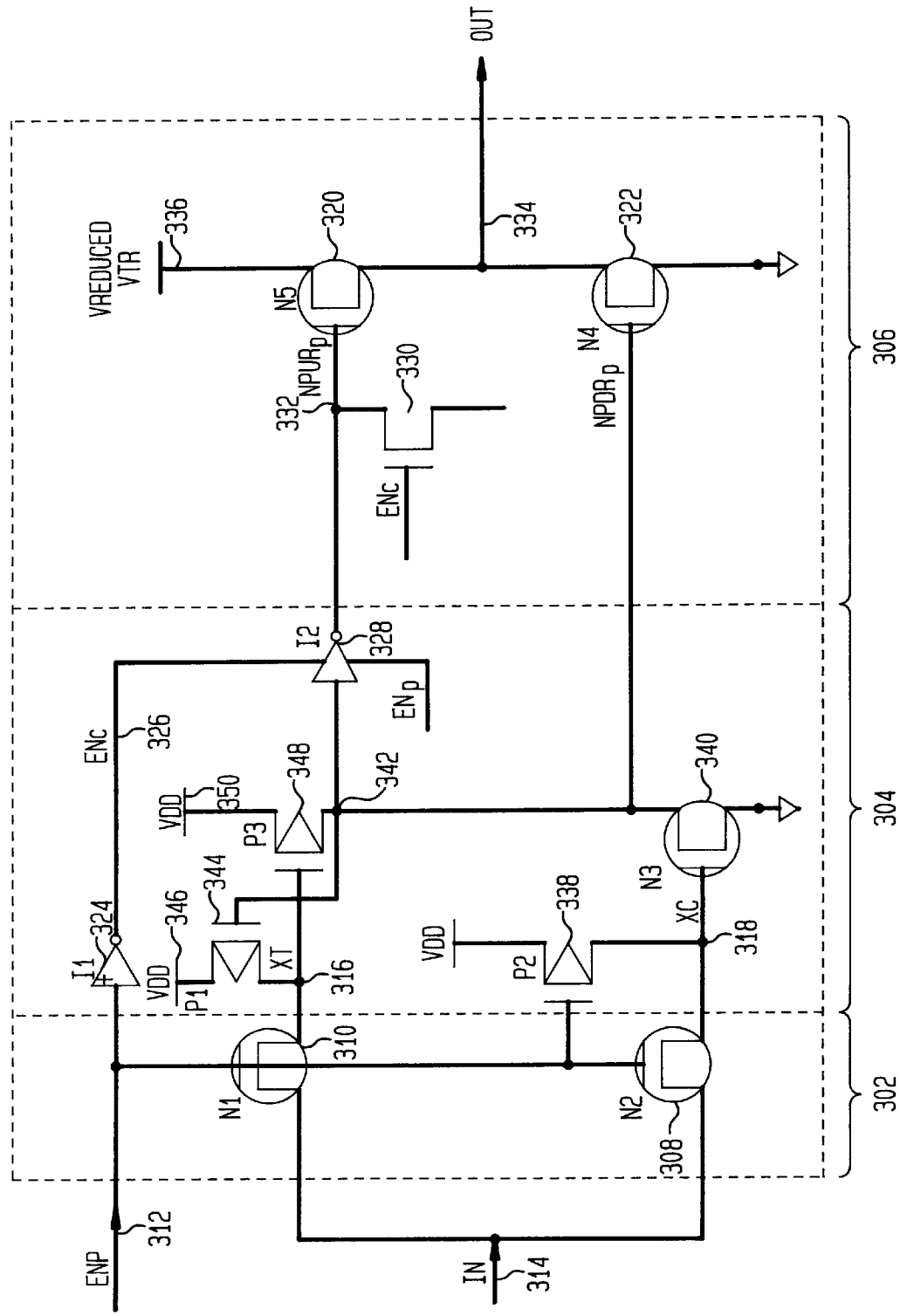
FIG. 4 illustrates, in greater detail and in accordance with one embodiment of the present invention, a tri-state buffer circuit that is capable of passing reduced voltage signals.

FIG. 4 illustrates, in greater detail and in accordance with one embodiment of the present invention, a tri-state buffer circuit 300, representing a non-inverting tri-state buffer capable of accepting a reduced voltage input and driving a load with its reduced voltage output. Buffer circuit 300 includes an input stage 302, a level shifter stage 304, and an output stage 306. Input shifter stage 302 includes two field effect transistors (FETs) 308 and 310, whose gates are controlled by buffer enable signal ENp on conductor 312. The reduced voltage input signal is received at buffer input node 314 and passed by FETs 308 and 310 to nodes 316 and 318 when the buffer enable signal is enabled (i.e., when signal ENp is high).

It should be noted that although FETs 308 and 310 are represented in the drawing as low-threshold n-FETs (the low threshold characteristic is represented by the circle surrounding the transistor symbol), such is not a requirement as long as the threshold voltage of these input transistors is lower than the input voltage range. Low threshold transistors are, however, preferred (but not required) for these transistors. In general, low threshold FETs may have a lower threshold voltage (e.g., about 0.4V to about 0.5V) than typical FETs (which may be around 0.6V–0.7V).

Level shifter stage 304 receives the signals from input stage 302 and shifts the received signals to a higher voltage range to control gates of FETs 320 and 322 in output stage 306. Depending on the value of the reduced voltage input signal on input node 314, output stage 306 outputs either a logical low ($V_{SS}$) or a logical high (the high value of the reduced voltage range, or $V_{REDUCED}$ herein). Accordingly, a reduced voltage input/reduced voltage output buffer circuit is formed.

Like transistors 310 and 308, output transistors 320 and 322 are represented in the drawing as low-threshold n-FETs (the low threshold characteristic is represented by the circle surrounding the transistor symbol). Although low threshold transistors are preferred for these output transistors for optimum performance, transistors which may have a more typical threshold voltage range may also be employed.

To facilitate further understanding, the operation of tri-state buffer 300 will now be explained in detail. Consider the situation wherein the buffer enable signal is disabled to permit tri-state buffer to enter the tri-state mode. In the circuit of FIG. 4, the tri-state mode is entered when signal ENp on conductor 312 is low. With low signal ENp, n-type FETs 308 and 310 are off, thereby preventing the signal at input node 314 from being passed to level shifter stage 304.

Inverter 324 causes signal ENc (which is the inverse of signal ENp) to go high on conductor 326, thereby putting tri-state inverter 328 in a high impedance state and decoupling the tri-state inverter output from its input. A high signal ENc also turns on n-FET 330 to pull node 332 low, thereby turning off n-type FET 320. Thus, buffer output 334 is decoupled from voltage source $V_{REDUCED}$ 336.

The low signal ENp on conductor 312 turns on p-type FET 338, thereby pulling node 318 high to turn on n-FET 340. When FET 340 conducts, node 342 is pulled to $V_{SS}$, thereby turning on p-FET 344 of level shifter stage 304. When FET 344 conducts, node 316 is pulled to $V_{DD}$ (by $V_{DD}$ voltage source 346) to turn off p-FET 348, thereby decoupling node 342 from $V_{DD}$ voltage source 350 and keeping node 342 at the $V_{SS}$ level (due to the fact that FET 340 conducts).

Since node 342 is low, FET 322 is also off, thereby decoupling buffer output 334 from $V_{SS}$. With FETs 320 and 322 off, buffer output 334 is decoupled from the remainder of the buffer circuit, $V_{REDUCED}$, and $V_{SS}$. In other words, buffer circuit 300 is tri-stated and decoupled from the load.

When the buffer enable signal is enabled (i.e., when signal ENp of FIG. 4 is high), buffer circuit 300 is taken out of the tri-state mode. Accordingly, the voltage value on buffer output 334 will vary within the range 0-$V_{REDUCED}$ responsive to the voltage value on input node 314.

Consider the situation when signal ENp is high and a $V_{SS}$ voltage level appears on input node 314. The high signal ENp causes FETs 308 and 310 to turn on, passing the $V_{SS}$ voltage level to nodes 318 and 316 respectively. Since FET 310 conducts, node 316 goes low to turn on FET 348, thereby pulling node 342 to $V_{DD}$ (by $V_{DD}$ voltage source 350). Since ENp is high and its inverted ENc signal is low, tri-state inverter 328 passes the value on node 342 to node 332, causing node 332 to go low (since tri-state inverter 328 inverts its output relative to its input). The low signal ENc turns off FET 330, thereby decoupling node 332 from $V_{SS}$. Since node 332 is at $V_{SS}$, FET 320 is turned off to decouple buffer output 334 from $V_{REDUCED}$ voltage source 336.

The low node 318 (p-FET 338 is turned off by the high ENp signal to ensure that node 318 stays low) turns off FET 340 to decouple node 342 from $V_{SS}$ and ensuring that node 342 stays at the $V_{DD}$ level (due to the fact that FET 348 conducts). With node 342 at the high $V_{DD}$ level, this full $V_{DD}$ voltage is applied to the gate of output FET 322, allowing FET 320 to source current to the load via buffer output 334 and to quickly pull buffer output 334 to the $V_{SS}$ voltage level. Thus, the presence of level shifter stage 304 allows gates of transistors 320 and 322 to be controlled by control signals having the full voltage range from $V_{SS}$–$V_{DD}$. As can be appreciated from the foregoing, a $V_{SS}$ input signal on input node 314 causes a $V_{SS}$ output signal to appear on output node 334 when buffer circuit 300 is not tri-stated.

Consider the situation when signal ENp is high (i.e., buffer circuit 300 is not tri-stated) and a $V_{REDUCED}$ voltage level appears on input node 314. The high signal ENp causes FETs 308 and 310 to turn on, passing the $V_{REDUCED}$ voltage level to nodes 318 and 316 respectively. Since FET 308 conducts, the $V_{REDUCED}$ voltage level is passed to node 318, thereby turning on FET 340 to pull node 342 to $V_{SS}$. When node 342 is pulled to $V_{SS}$, p-FET 344 is fully on to pull node 316 to $V_{DD}$ (by $V_{DD}$ voltage source 346). Thus node 316 is at $V_{DD}$ although the conduction of FET 310 only causes $V_{REDUCED}$ to be passed to node 316 from input node 314.

Since node 316 is at $V_{DD}$, this full $V_{DD}$ voltage is applied to the gate of p-FET 348 to fully turn FET 348 off, thereby decoupling node 342 from $V_{DD}$ voltage source 350 and ensuring that node 342 stays at the $V_{SS}$ level. It should be appreciated that level shifter stage 304 also functions to stabilize the voltage at node 342 at the $V_{SS}$ value to ensure that FET 322 stays fully off to decouple buffer output 334 from $V_{SS}$. Otherwise, FET 348 may be softly on when $V_{REDUCED}$ is passed to node 316 by FET 310, pulling the voltage at node 342 above the desired $V_{SS}$ value and degrading performance and/or causing the buffer circuit to malfunction and/or consuming an undue amount of power.

With signal ENp high and its inverted signal ENc low, the $V_{SS}$ value on node 342 causes node 332 to go to $V_{DD}$ (since tri-state inverter 328 outputs the inverted value of its input). The low signal ENc also turns off FET 330 to decouple node 332 from $V_{SS}$. With node 332 at the high $V_{DD}$ level, this full $V_{DD}$ voltage is applied to the gate of output FET 320, allowing FET 320 to source current to the load via buffer output 334 and to quickly pull buffer output 334 to the $V_{REDUCED}$ voltage level (by $V_{REDUCED}$ voltage source 336). Thus, the presence of level shifter stage 304 allows gates of transistors 320 and 322 to be controlled by control signals having the full voltage range from $V_{SS}$–$V_{DD}$. As can be appreciated from the foregoing, a $V_{REDUCED}$ input signal on input node 314 causes a $V_{REDUCED}$ output signal to appear on output node 334 when buffer circuit 300 is not tri-stated.

Note that although buffer circuit 300 is configured as a tri-state buffer circuit that is noninverting, such is not a requirement. Accordingly, the inventions herein are not necessarily limited to the inverting (or noninverting) feature of the reduced input voltage/reduced output voltage tri-state buffer circuit.

By using control signals having the full voltage swing ($V_{SS}$–$V_{DD}$) to control gates of output FETs 320 and 322, a higher overdrive voltage is obtained to turn on and off these FETs. If the reduced voltage $V_{REDUCED}$ had been employed to control gates of these output FETs, the FETs would need to be larger to source/sink the same amount of current in the same amount of time. Because the invention employs control signals having the full voltage swing ($V_{SS}$–$V_{DD}$) to control gates of output FETs 320 and 322, these FETs may be made smaller, which reduces space usage on chip.

Reducing the size of the output FETs also reduces the capacitive load to which the buffer circuit is coupled. This is advantageous in applications wherein multiple buffer circuits are employed to assert signals on a common bus conductor and multiple buffer circuit output stages may be coupled to that same common bus. By reducing the size and capacitance associated with the output FETs of the output stage in each buffer circuit, less load capacitance is presented to the buffer circuit that actually drives the bus conductor. With reduced load capacitance, latency and power consumption is advantageously reduced.

FIGS. 5–12 depict various alternative embodiments, showing the various exemplary manners in which input stage, the level shifter stage, and/or output stage may be configured. In each of these figures, the level shifter stage is employed to boost the reduced voltage input signal into control signals having a greater voltage range to control the output transistors in the output stage. The output transistors are connected in series between $V_{REDUCED}$ and $V_{SS}$ to output signals in this reduced voltage range. With the output transistors turned on and off by the higher voltage control signals from the level shifter stage, these transistors can advantageously source or sink a greater amount of current to drive the load with reduced latency.

Figure 5:
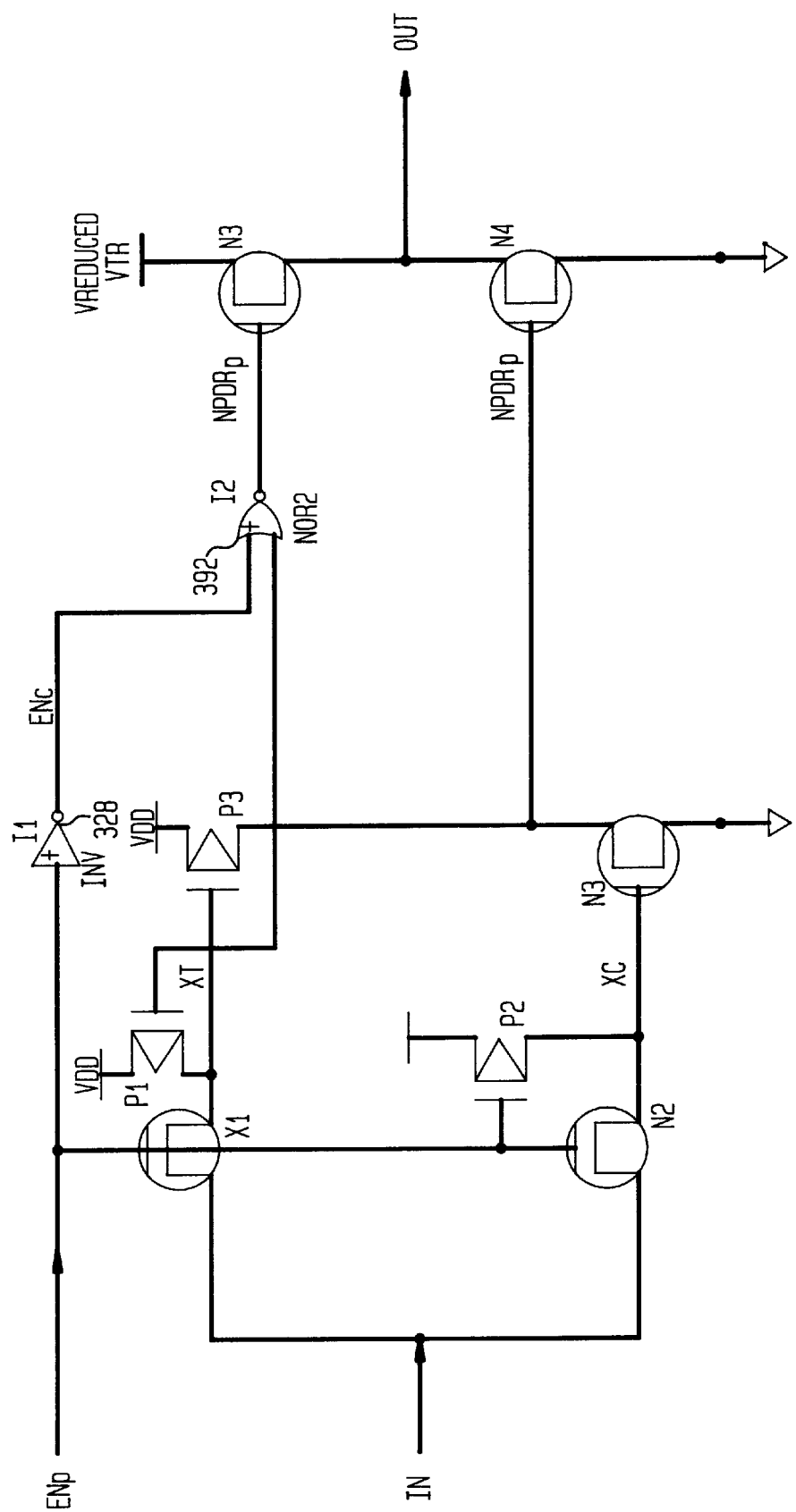
FIGS. 5–12 illustrate, in accordance with various embodiments of the present invention, various alternative configurations of the reduced voltage input/reduced voltage output tri-state buffer circuit.
Figure 6:
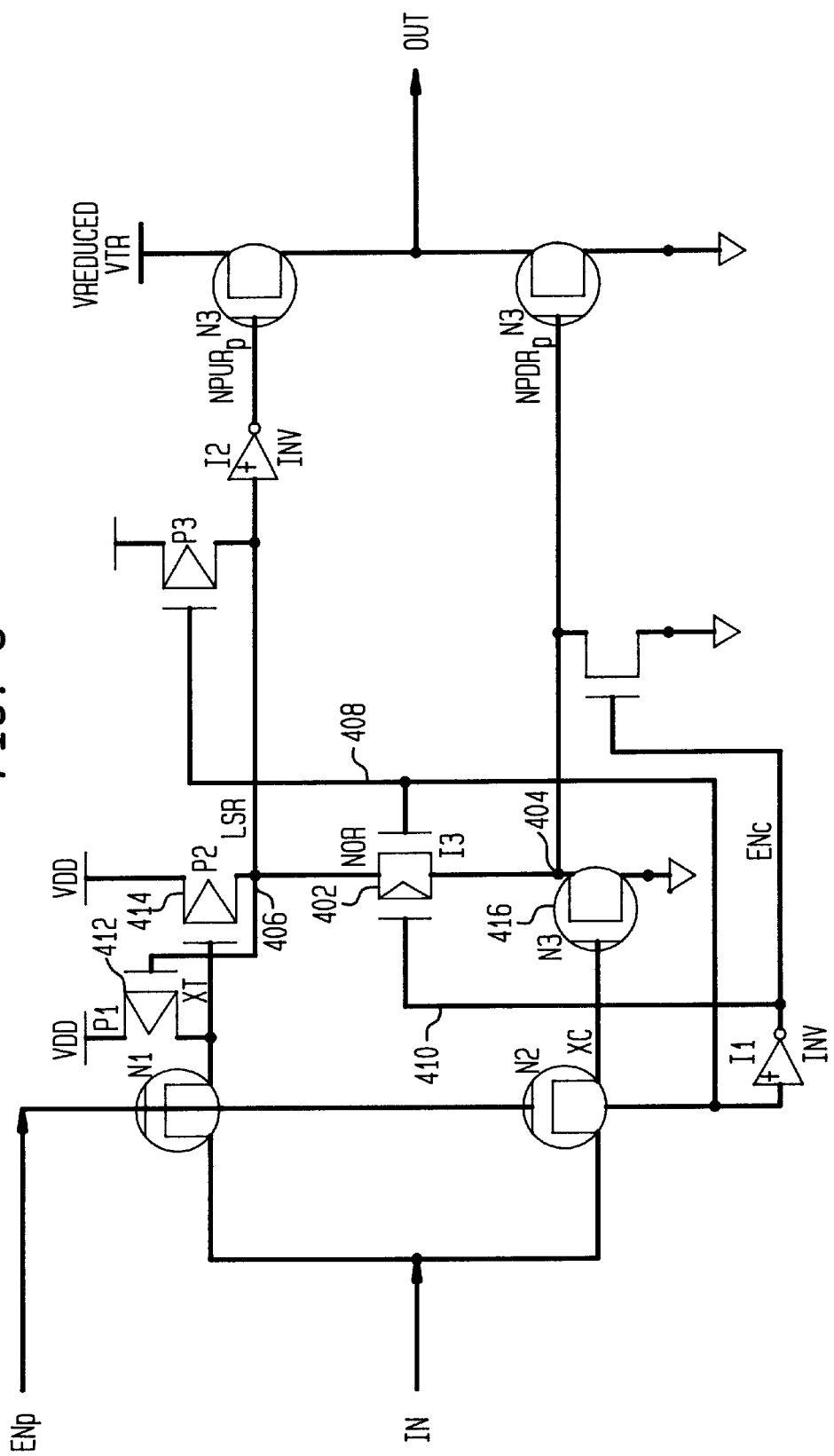

In FIG. 5, the level shifter stage is implemented by a NOR gate 392 instead of a tri-state inverter as in the case of FIG. 4. In FIG. 6, a transmission gate 402 is employed instead in the level shifter stage. Transmission gate 402 functions to pass the voltage between its two nodes, i.e., between nodes 404 and node 406, responsive to control signals 408 and 410. Again, the level shifter stage comprising transmission gate 402, transistors 412, 414, and 416 ensures that node 404 stays low when a logical high signal having a reduced voltage (e.g., 1V) appears at the buffer input. The remainder of the buffer of FIG. 6 functions roughly in an analogous manner to the buffer of FIG. 4, and the operation of the buffer of FIG. 6 is readily understandable to one skilled in the art in view of this disclosure.

Figure 7:
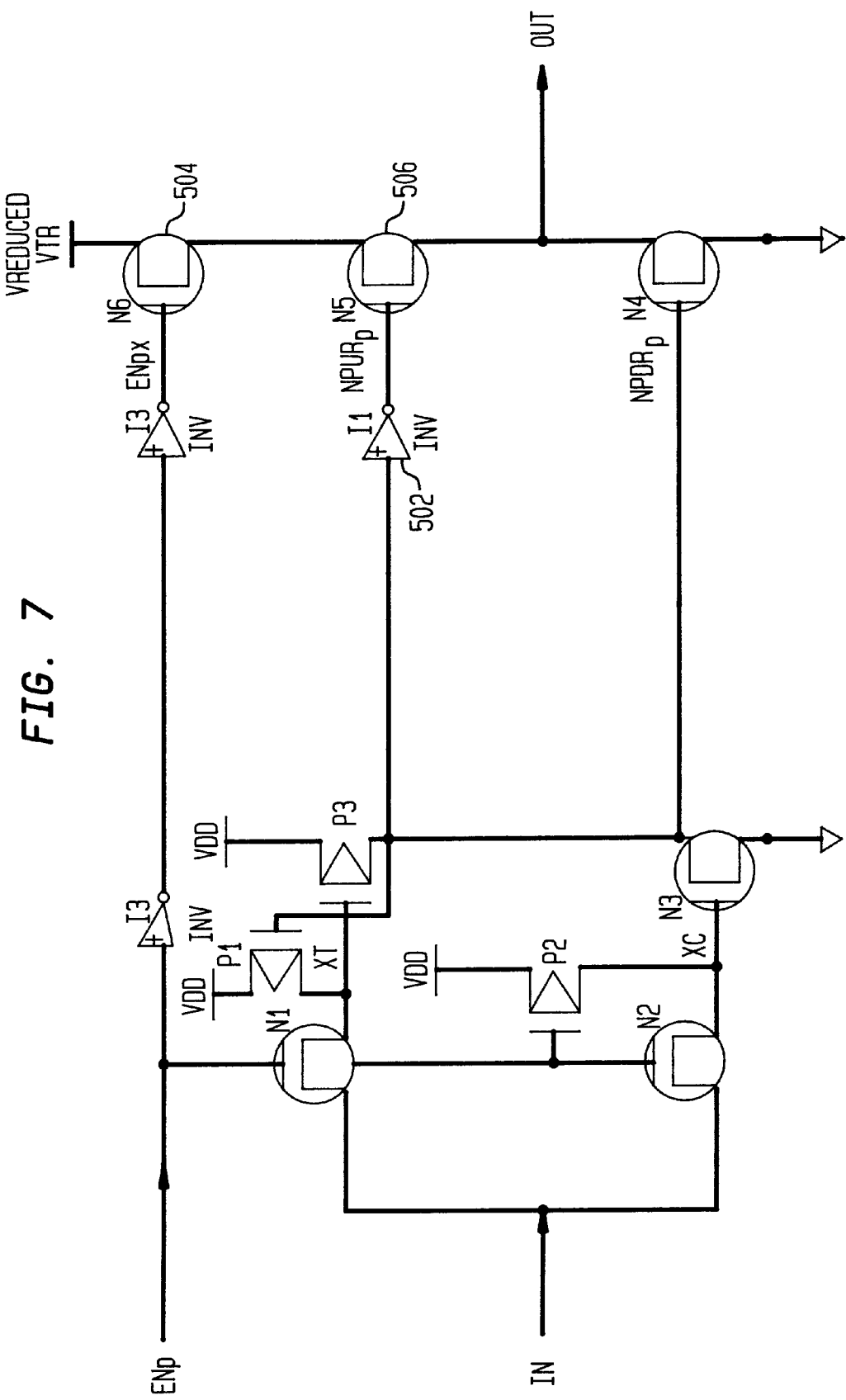
Figure 8:
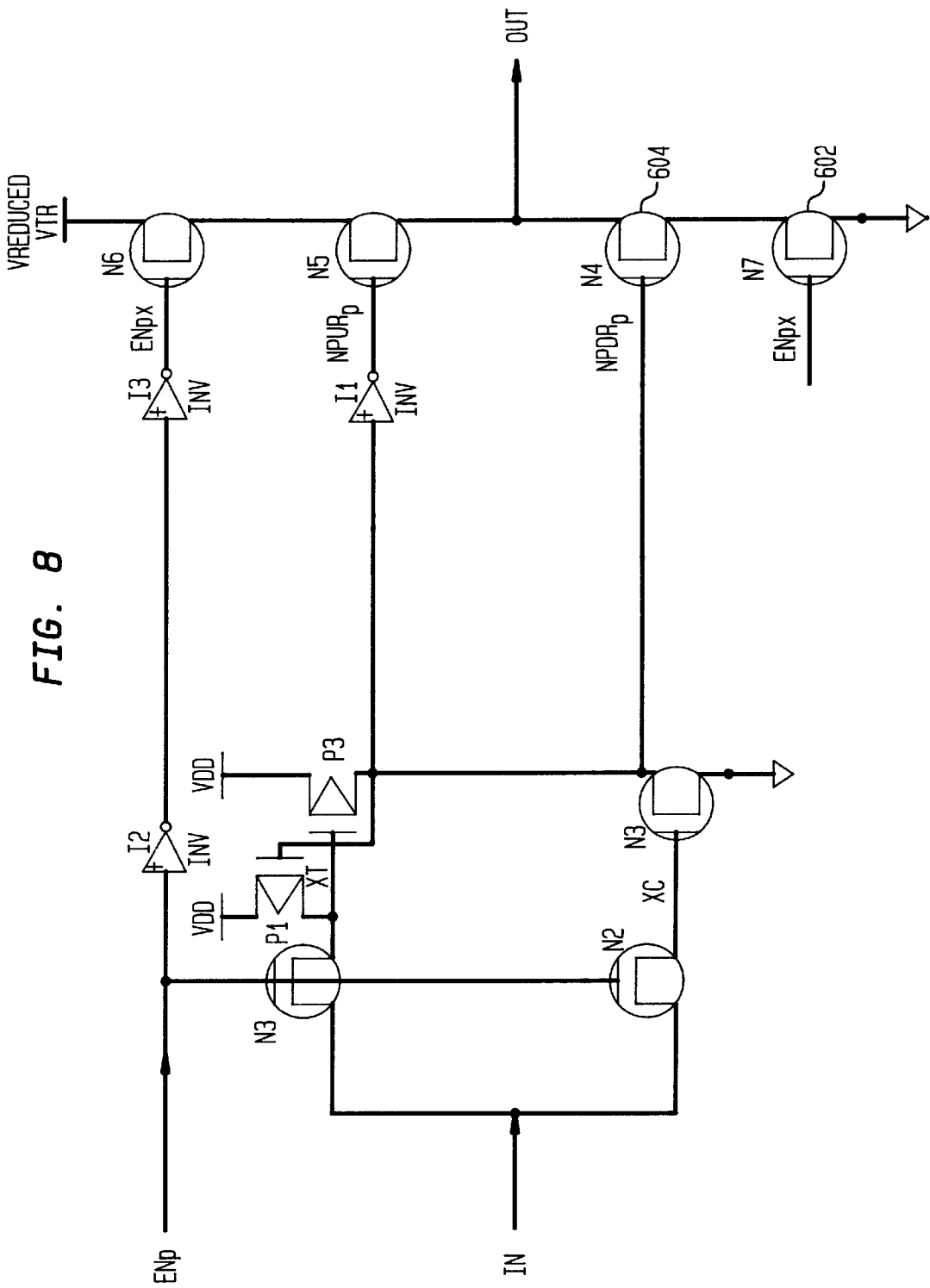

In FIG. 7, an inverter 502 is employed in the level shifter stage to furnish control signals having the voltage range between $V_{SS}$ and $V_{DD}$ to the output transistors. Two inverters are shown coupled to the gate of transistor 504 to source sufficient current for properly controlling transistor 504. However, they may be omitted if the buffer enable signal can sufficiently control transistor 504. There are three output transistors in the output stage, of which transistor 504 acts to quickly decouple the $V_{REDUCED}$ voltage source from the output when signal ENp is low. As a tradeoff, however, each of output transistors 504 and 506 may be required to be larger to reduce the resistance in series between the $V_{REDUCED}$ voltage source and the output. The larger transistor 506 may contribute to a higher capacitive load, especially when multiple tri-state buffers are coupled to the same output. In FIG. 8, output transistor 602 is added to ensure that $V_{SS}$ is also quickly decoupled from the output when the ENp signal is low. Again, the tradeoff results in larger transistors 602 and 604 to overcome the series resistance. The remainder of the buffers of FIGS. 7 and 8 function roughly in an analogous manner to the buffer of FIG. 4, and the operation of these buffers is readily understandable to one skilled in the art in view of this disclosure.

Figure 9:
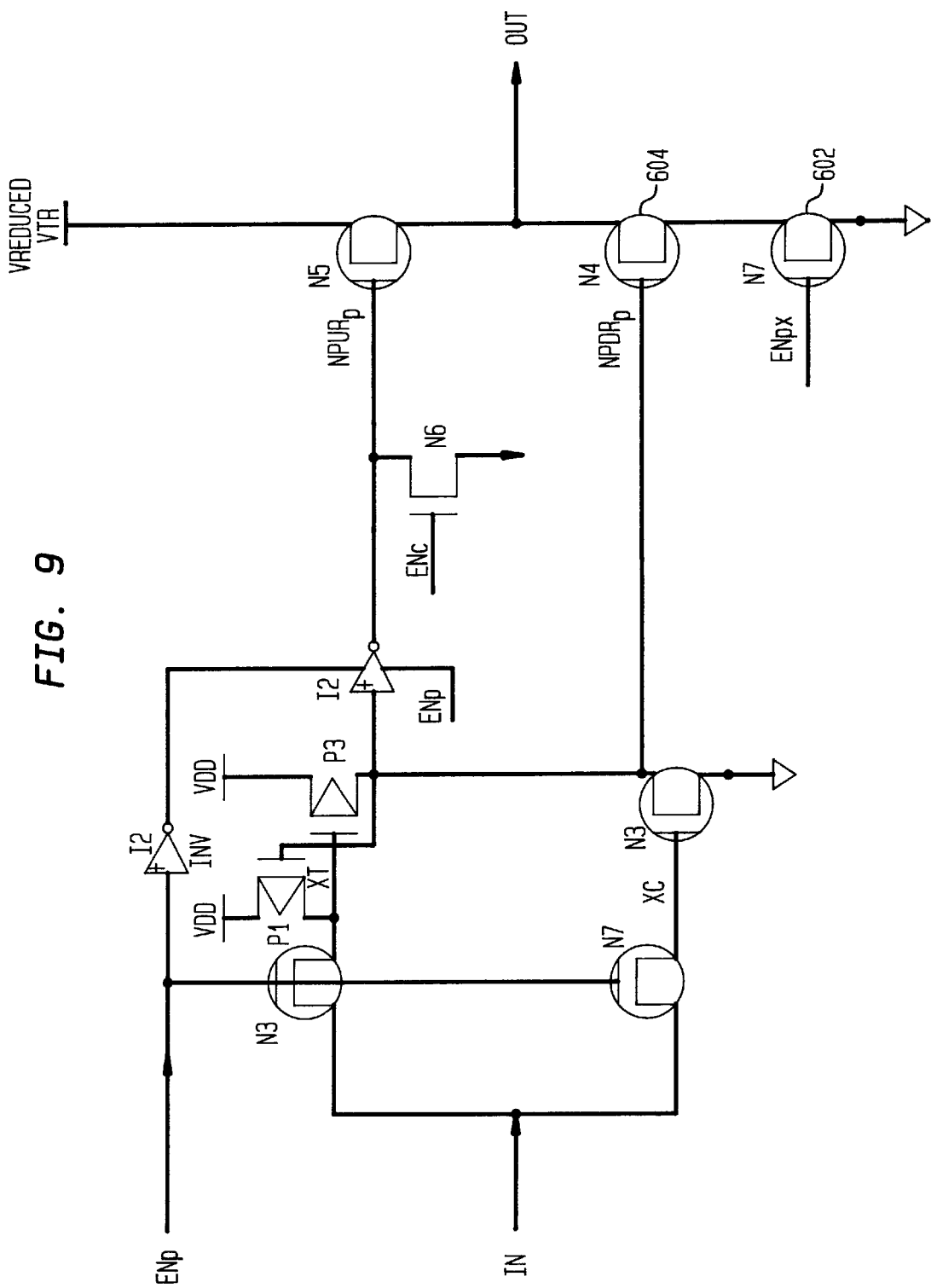
Figure 10:
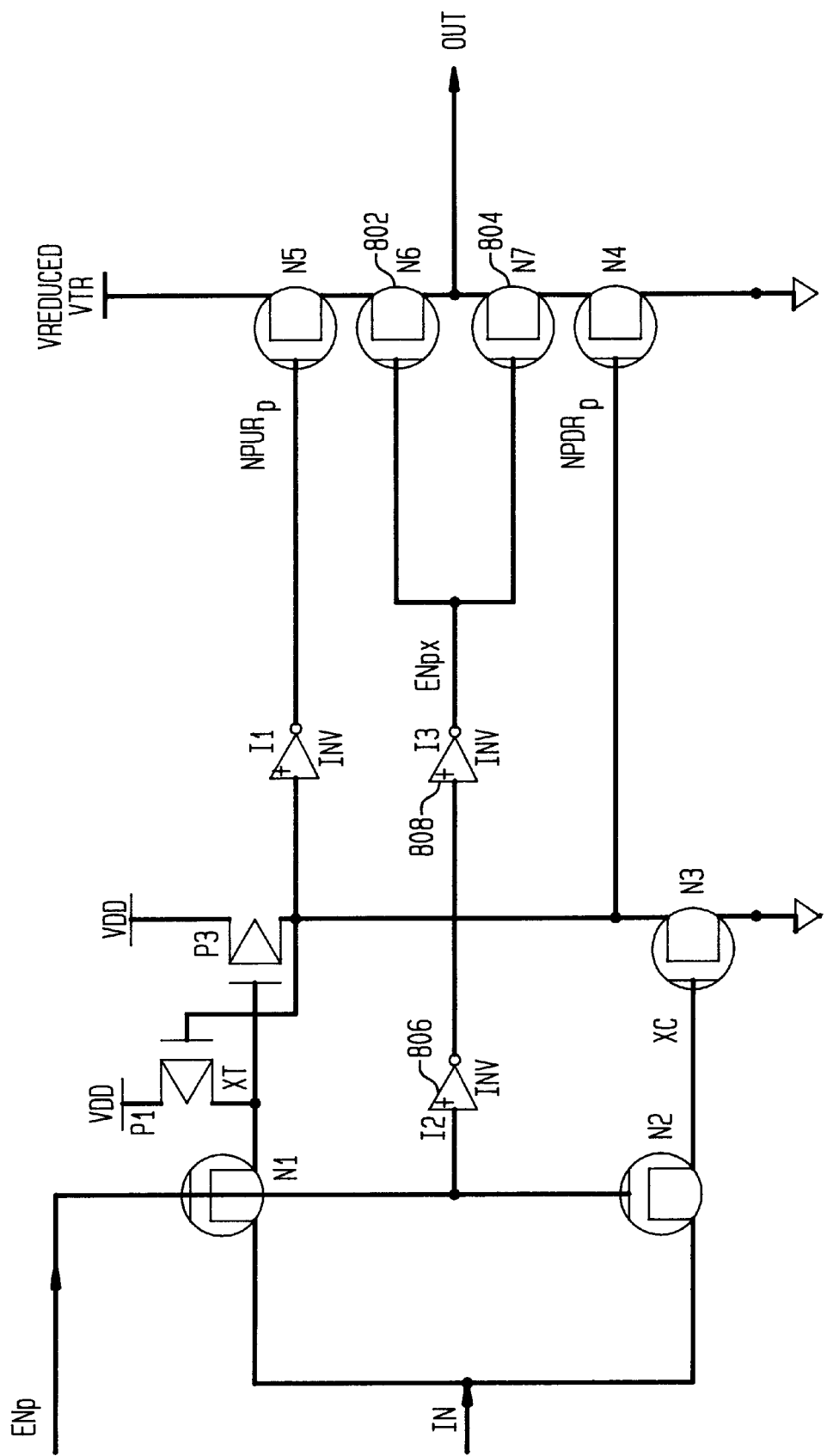
Figure 11:
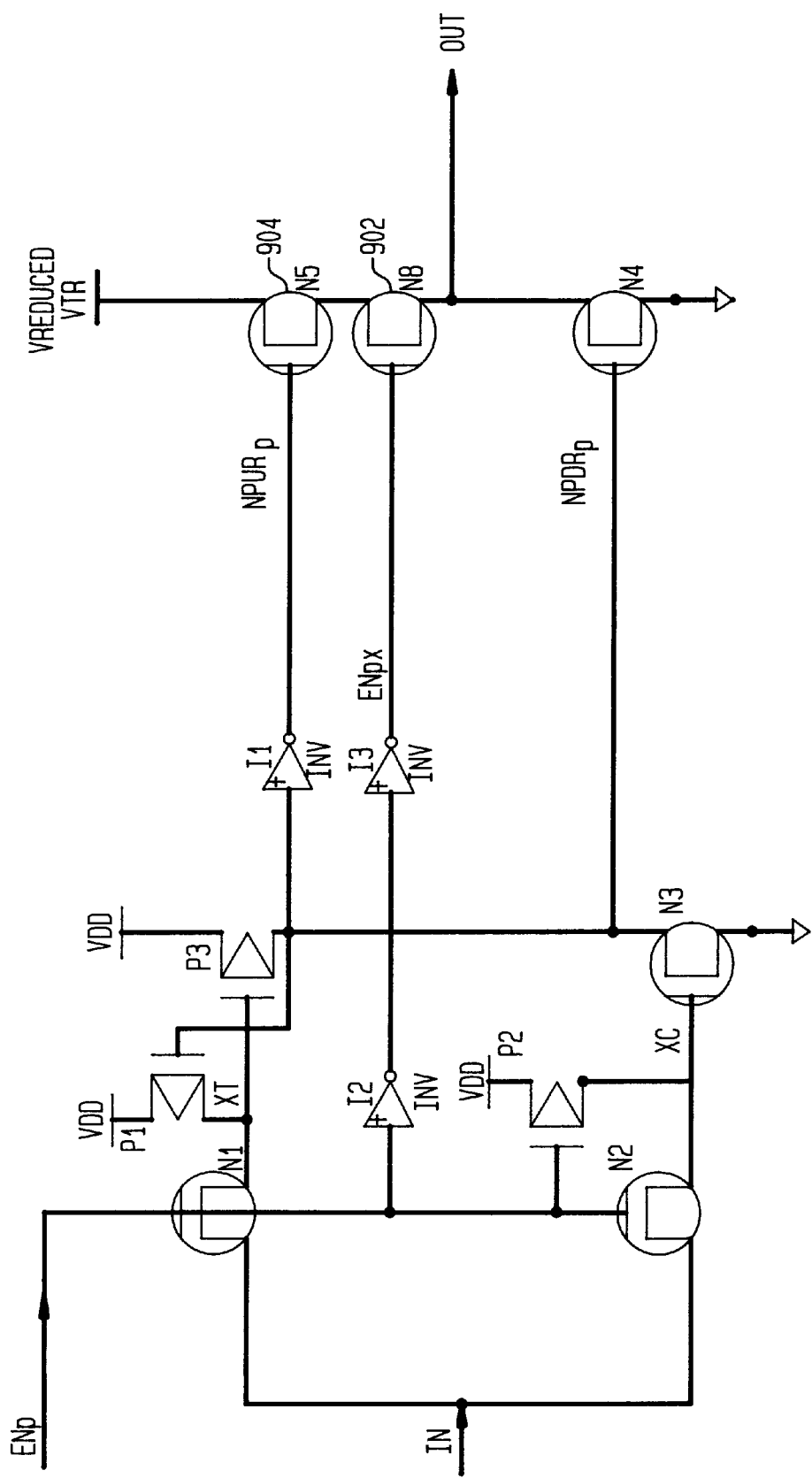
Figure 12:
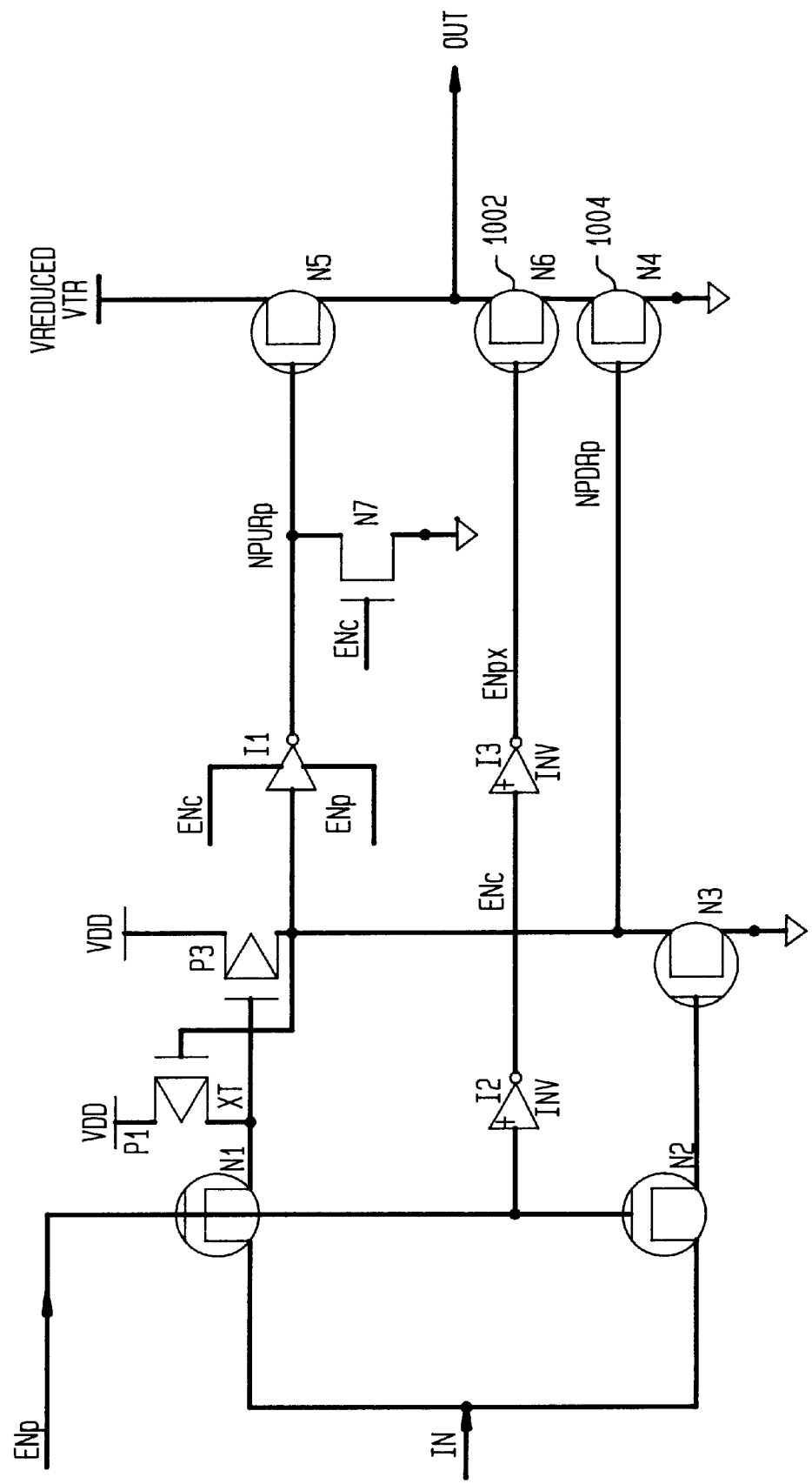

In FIG. 9, a tri-state inverter 702 is employed in the level shifter stage. Tri-state inverter 702 operates in an analogous manner to tri-state inverter 328 of FIG. 4. In FIG. 10, transistors 802 and 804 in the output stage are coupled to signal ENpx (generated by inverters 806 and 808 of the level shifter stage) to facilitate fast decoupling of the output from both $V_{SS}$ and $V_{REDUCED}$. However, the presence of four transistors in series in the output stage may require larger devices to be employed to overcome the series resistance. In FIG. 11, decoupling of the output from $V_{SS}$ is performed in the same manner as was done in the buffer of FIG. 4. Decoupling of the output from $V_{REDUCED}$ is accomplished by transistor 902, albeit at the potential cost of requiring larger devices to be employed for transistors 902 and 904. In FIG. 12, decoupling of the output from $V_{REDUCED}$ is performed in the same manner as was done in the buffer of FIG. 4. Decoupling of the output from $V_{SS}$ is accomplished by transistor 1002, albeit at the potential cost of requiring larger devices to be employed for transistors 1002 and 1004. The remainder of the buffers of FIGS. 9–12 function in a roughly analogous manner to the buffer of FIG. 4, and the operation of these buffers are readily understandable to one skilled in the art in view of the remainder of this disclosure.

While this invention has been described in terms of several illustrative embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A buffer circuit comprising:

a high power source at a high voltage level ($V_{DD}$) coupled to the buffer circuit, wherein $V_{DD}$ is used to operate most of logic circuits of the buffer circuit;

a low power source at a low voltage level ($V_{SS}$) coupled to the buffer circuit;

an input node for receiving an input signal;

an enable node for receiving an enable signal;

an output node;

the buffer circuit, in response to an input signal having a reduced voltage range and an active enable signal, generates an output signal having the reduced voltage range, wherein the reduced voltage range comprises a logic 0 level of about $V_{SS}$ and a logic 1 level of about $V_{RED}$, where $V_{RED}$ is less than $V_{DD}$; and the buffer circuit, in response to an inactive enable signal, decouples the input node from the output node.

2. The buffer circuit of claim 1 is an inverting buffer circuit, the inverting buffer circuit generates logic 1 output signal at the output node in response to logic 0 input signal at the input node and the active enable signal at the enable node, and generates logic 0 output signal at the output node in response to logic 1 input signal at the input node and the active enable signal at the enable node.

3. The buffer circuit of claim 2 comprises:

a level shifter stage, the level shifter stage receives the input signal and generates output control signals having voltage range in which logic 0 is equal to about $V_{SS}$ and logic 1 is greater than $V_{RED}$;

a reduced power source equal to about $V_{RED}$;

an output stage coupled to the level shifter stage, the reduced power source and the low power source, the output stage receives the control signals and generates the output signal at the output node.

4. The buffer circuit of claim 3 wherein $V_{TH} < V_{RED} \leq 1V$, where $V_{TH}$ is the threshold voltage of transistors.

5. The buffer circuit of claim 2 wherein $V_{TH} < V_{RED} < 1V$, where $V_{TH}$ is the threshold voltage of transistors.

6. The buffer circuit of claim 1 comprises:

a level shifter stage, the level shifter stage receives the input signal and generates output control signals having voltage range in which logic 0 is equal to about $V_{SS}$ and logic 1 is greater than $V_{RED}$;

a reduced power source equal to about $V_{RED}$;

an output stage coupled to the level shifter stage, the reduced power source and the low power source, the output stage receives the control signals and generates the output signal at the output node.

7. The buffer circuit of claim 6 wherein wherein $V_{TH} < V_{RED} < 1V$, where $V_{TH}$ is the threshold voltage of transistors.

8. The buffer circuit of claim 1 wherein $V_{TH} < V_{RED} < 1V$, where $V_{TH}$ is the threshold voltage of transistors.

9. The buffer circuit of claim 1 wherein the level shifter comprises:

a first sub-stage, the first sub-stage receives the input signal and generates first sub-stage output signals having a high voltage range in which logic 0 is equal to about $V_{SS}$ and logic 1 is equal to about $V_{DD}$; and a second sub-stage coupled to the first sub-stage to receive the first sub-stage output signal, the second sub-stage generates the output control signals for the output stage.

10. The buffer circuit of claim 9 wherein the first sub-stage of the level shifter stage comprises:

a first field effect transistor having a first terminal coupled to the high power source and a second terminal coupled to first input and output nodes of the first sub-stage, the first sub-stage receives the input signal having the reduced voltage range at the first input node and generates a first output signal having the high voltage range at the first output node; and a second input node coupled to a second output node of the first sub-stage, the second input node receives the input signal having the reduced voltage range.

11. The buffer circuit of claim 10 wherein the first sub-stage further comprises a second field effect transistor having a first terminal coupled to the high voltage source and a second terminal coupled to the second input and second output nodes of the first sub-stage, the first sub-stage receives the input signal having the reduced voltage range and generates a second output signal of the first sub-stage having the high voltage range.

12. The buffer circuit of claim 11 wherein the second sub-stage of the level shifter stage comprises:

a first field effect transistor having a first terminal coupled to a second sub-stage power source having a voltage level greater than $V_{RED}$, a second terminal coupled to a first level shifter output node for outputting a first of the output control signals, and a gate terminal coupled to a first input node of the second sub-stage, the first input node receives the first output signal of the first sub-stage;

a second field effect transistor having a first terminal coupled to a second level shifter output node for outputting a second of the output control signals, a second terminal coupled to the low power source, and a gate terminal coupled to a second input node of the second sub-stage, the second input node receives the second output signal of the first sub-stage.

13. The buffer circuit of claim 12 wherein the voltage level of the second sub-stage power source is equal to $V_{DD}$.

14. The buffer circuit of claim 13 further comprises an inverter circuit, wherein an inverter input terminal is coupled to the second terminal of the first field effect transistor of the second sub-stage and an inverter output terminal is coupled to the first output node of the second sub-stage.

15. The buffer circuit of claim 14 wherein the inverter circuit comprises a tri-state inverter, wherein a tri-state control terminal is coupled to the enable signal.

16. The buffer circuit of claim 12 further comprises an inverter circuit, wherein an inverter input terminal is coupled to the second terminal of the first field effect transistor of the second sub-stage and an inverter output terminal is coupled to the first output node of the second sub-stage.

17. The buffer circuit of claim 16 wherein the inverter circuit comprises a tri-state inverter, wherein a tri-state control terminal is coupled to the enable signal.

18. The buffer circuit of claim 10 wherein the second sub-stage of the level shifter stage comprises:

a first field effect transistor having a first terminal coupled to a second sub-stage power source having a voltage level greater than $V_{RED}$, a second terminal coupled to a first level shifter output node for outputting a first of the output control signals, and a gate terminal coupled to a first input node of the second sub-stage, the first input node receives the first output signal of the first sub-stage;

a second field effect transistor having a first terminal coupled to a second level shifter output node for outputting a second of the output control signals, a second terminal coupled to the low power source, and a gate terminal coupled to a second input node of the second sub-stage, the second input node receives the second output signal of the first sub-stage.

19. The buffer circuit of claim 18 further comprises an inverter circuit, wherein an inverter input terminal is coupled to the second terminal of the first field effect transistor of the second sub-stage and an inverter output terminal is coupled to the first output node of the second sub-stage.

20. The buffer circuit of claim 19 wherein the inverter circuit comprises a tri-state inverter, wherein a tri-state control terminal is coupled to the enable signal.

21. The buffer circuit of claim 9 wherein the second sub-stage of the level shifter stage comprises:
    a first field effect transistor having a first terminal coupled to a second sub-stage power source having a voltage level greater than $V_{RED}$, a second terminal coupled to a first level shifter output node for outputting a first of the output control signals, and a gate terminal coupled to a first input node of the second sub-stage, the first input node receives the first output signal of the first sub-stage;
    a second field effect transistor having a first terminal coupled to a second level shifter output node for outputting a second of the output control signals, a second terminal coupled to the low power source, and a gate terminal coupled to a second input node of the second sub-stage, the second input node receives the second output signal of the first sub-stage.

22. The buffer circuit of claim 21 further comprises an inverter circuit, wherein an inverter input terminal is coupled to the second terminal of the first field effect transistor of the second sub-stage and an inverter output terminal is coupled to the first output node of the second sub-stage.

23. The buffer circuit of claim 22 wherein the inverter circuit comprises a tri-state inverter, wherein a tri-state control terminal is coupled to the enable signal.

24. The buffer circuit of claim 23 further includes an input stage comprising:
    a first field effect transistor with first, second and gate terminals; and
    a second field effect transistor with first, second, and gate terminals,
        wherein the gate terminals of the first and second field effect transistors of the input stage are coupled to the enable signal,
        the first terminals of said first and second field effect transistors are configured to receive the input signal, and
        the second terminals of the first and second field effect transistors are coupled to first and second output nodes of the input stage, the first and second output nodes are coupled to first and second input nodes of the level shifter stage, the active enable signal renders first and second field effect transistors conductive, passing the input signal at the first terminals to the second terminals of the field effect transistors.

25. The buffer circuit claim 24 wherein the second sub-stage of the level shifter stage comprises:
    a first field effect transistor having a first terminal coupled to a second sub-stage power source having a voltage level greater than $V_{RED}$, a second terminal coupled to a first level shifter output node for outputting a first of the output control signals, and a gate terminal coupled to a first input node of the second sub-stage, the first input node receives the first output signal of the first sub-stage;
    a second field effect transistor having a first terminal coupled to a second level shifter output node for outputting a second of the output control signals, a second terminal coupled to the low power source, and a gate terminal coupled to a second input node of the second sub-stage, the second input node receives the second output signal of the first sub-stage.

26. The buffer circuit of claim 25 further comprises an inverter circuit, wherein an inverter input terminal is coupled to the second terminal of the first field effect transistor of the second sub-stage and an inverter output terminal is coupled to the first output node of the second sub-stage.

27. The buffer circuit of claim 26, wherein the inverter circuit comprises a tri-state inverter, wherein a tri-state control terminal is coupled to the enable signal.

28. The buffer circuit of claim 1 comprises:
    level shifter means, the level shifter stage receives the input signal and generates output control signals with a voltage range in which logic 0 equals to $V_{SS}$ and logic 1 is greater than $V_{RED}$;
    a reduced power source equal to about $V_{RED}$;
    output means coupled to the level shifter stage, the reduced power source and the low power source, the output stage receives the control signals and generates the output signal at the output node having the reduced voltage range.

29. The buffer circuit of claim 28 further comprises input means for receiving the input signal and passing the input signal to the level shifter means in response to the active enable signal.

30. The buffer circuit of claim 29 wherein the logic 1 of the output control signals is equal to about $V_{DD}$.

31. The buffer circuit of claim 28 wherein the logic 1 of the output control signals is equal to about $V_{DD}$.

32. A method of operating a buffer circuit comprising:
    providing a high voltage source equal to about $V_{DD}$ to the buffer circuit, the high voltage source is used to operate most logic circuits of the buffer circuit;
    providing a low voltage source equal to $V_{SS}$;
    receiving an input signal at an input node, the input signal having a reduced voltage range, the reduced voltage range comprises a logic 0 equal to $V_{SS}$ and a logic 1 equal to $V_{RED}$, where $V_{RED}$ is less than about $V_{DD}$;
    generating control signals in response to the input signal, the control signal comprises a voltage range in which logic 0 is equal to $V_{SS}$ and logic 1 is equal to a voltage level greater than $V_{RED}$; and
    outputting an output signal with reduced voltage range in response to the control signals.

33. The method of claim 32 further comprises generating control signals to output an inverted output signal with reduced voltage range.

34. The buffer circuit of claim 32 wherein $V_{TH}<V_{RED}\leq1V$, where $V_{TH}$ is the threshold voltage of transistors.

35. The method of claim 34 wherein the voltage level of the logic 1 control signals is equal to about $V_{DD}$.

36. The method of claim 32 wherein the voltage level of the logic 1 control signals is equal to about $V_{DD}$.

* * * * *